United States Patent [19]

Stephens

[11] 4,122,365

[45] Oct. 24, 1978

[54] PIEZOELECTRIC BUZZER DEVICE

[75] Inventor: Gerald D. Stephens, Vandalia, Ohio

[73] Assignee: Projects Unlimited, Inc., Dayton, Ohio

[21] Appl. No.: 652,285

[22] Filed: Jan. 26, 1976

[51] Int. Cl.² .............................................. H01L 41/10

[52] U.S. Cl. ...................................... 310/324; 310/316

[58] Field of Search .................... 310/8.2, 8.3, 8.5, 9.1, 310/9.4, 8.6, 322, 324, 334, 316; 340/384 E, 388; 179/110 A

[56] References Cited

U.S. PATENT DOCUMENTS

| | | | |
|---|---|---|---|
| 3,331,970 | 7/1967 | Dundon et al. | 310/9.1 |
| 3,815,129 | 6/1974 | Sweany | 340/388 |
| 3,839,652 | 10/1974 | Schafft | 310/8.6 |
| 3,860,838 | 1/1975 | Kumon | 310/8.5 |
| 3,890,513 | 6/1975 | Barleen et al. | 310/9.1 |

*Primary Examiner*—Mark O. Budd

*Attorney, Agent, or Firm*—Biebel, French & Nauman

[57] ABSTRACT

A piezoelectric buzzer has a piezoelectric crystal mounted on a circular mounting plate. Supporting struts are integrally formed in the mounting plate by punching strut shaped portions in the plate and bending these portions such that they are substantially perpendicular to the plate. The struts are positioned on the nodal circle of the transducer so that the vibration of the transducer is not substantially impaired by the mounting arrangement. An oscillator circuit is connected to provide a potential between the mounting plate and a first electrode positioned on the surface of the crystal opposite the mounting plate. A second electrode, positioned on the surface of the piezoelectric crystal adjacent the first electrode, provides a feedback signal to the oscillator circuit. The unique buzzer design allows the buzzer components to be assembled by a one-step soldering process.

2 Claims, 8 Drawing Figures

PIEZOELECTRIC BUZZER DEVICE

BACKGROUND OF THE INVENTION

The present invention relates to piezoelectric sonic transducers and more particularly to a buzzer in which the piezoelectric element is mounted on a metallic plate which acts as an electrode and which includes a plurality of integrally formed supporting struts. It has been known to use a piezoelectric device, such as a lead zirconate crystal, to change electrical energy into mechanical energy in the form of sound. It is known that if an electrical potential is placed across such a crystal, the crystal will deform in shape. If the potential is then removed, the crystal will return to its original configuration. Application of an alternating voltage of appropriate frequency to such a crystal results in rapid vibration of the crystal and consequently the emission of sound waves. The use of such a piezoelectric device in a buzzer is advantageous in that no adjustment is needed and the sparking which is characteristic of electromagnetic buzzers is eliminated.

Various approaches have been taken to mount a sonic transducer crystal in a buzzer. U.S. Pat. No. 2,831,989 to Ianouchevsky, issued Apr. 22, 1958, discloses a support for a crystal which includes three support members spaced around a crystal disc at points on the nodal plane of the disc. At such nodal points, the flexure of the crystal disc will be minimized and the support mechanisms will therefore not be subjected to intense vibration.

U.S. Pat. No. 3,263,103 to Frazier et al., issued July 26, 1966, discloses a crystal mount in which leads to the crystal electrodes also serve as support members for the crystal. Similarly U.S. Pat. No. 3,085,167 to Kritz, issued Apr. 9, 1963, and U.S. Pat. No. 3,114,848 issued Dec. 17, 1963, to Kritz show a sonic transducer in which the support members are equidistantly spaced around a piezoelectric disc on the nodal circle of the disc. One or all of the support members may be electrically connected to the exciting oscillator circuit.

U.S. Pat. No. 3,022,431 to McKnight, issued Feb. 20, 1962, shows a manner of crystal support in which two supports are each electrically connected to one of two opposing electrodes on a piezoelectric crystal, thus avoiding the necessity of providing separate electrode contacting wires.

U.S. Pat. No. 3,331,970 to Dundon et al., issued July 18, 1967, shows a method of transducer support in which clips are arranged around the periphery of the transducer assembly to grasp the transducer.

U.S. Pat. No. 3,857,146 to Engdahl shows a suspension for a quartz rod where the supporting members are formed form a single sheet of metal to provide a rugged and easily fabricated support member.

As shown in U.S. Pat. No. 3,277,466 to Potter, issued Oct. 4, 1966, it is also known to use a transducer having an electrode providing a feedback signal to the oscillator circuit which indicates that flexure has occurred. In the manner, the oscillator circuit causes the piezoelectric device to oscillate at the natural frequency of the transducer.

SUMMARY OF THE INVENTION

A piezoelectric buzzer comprises a circular mounting plate which includes a plurality of integrally formed leg members. The leg members are positioned at points along a nodal circle of the piezoelectric device. A piezoelectric crystal mounted centrally on the mounting plate includes an electrode positioned on the side of the crystal opposite the mounting plate. A printed circuit board is connected to the leg members and has mounted upon it an oscillator circuit which is electrically connected to the mounting plate and the electrode. Power input terminals are also mounted on the circuit board. The oscillator circuit is connected to the power terminals and applies a pulsating potential to the crystal through the mounting plate and the electrode to cause the crystal to vibrate when a potential is applied to the power terminals.

The transducer includes a cover enclosing the circuit board, the crystal, the mounting plate and the oscillator; and, further, the cover may include a cylindrical circumferentially threaded portion. The leg members may advantageously be formed by punching strut shaped portions in the circular mounting plate and bending these portions such that they are perpendicular to the plane of the mounting plate.

Accordingly, it is an object of the present invention to provide a piezoelectric buzzer in which a piezoelectric crystal is mounted on a plate having integrally formed leg members; to provide such a buzzer in which one or more of the leg members act as conductors and the plate acts as an electrode; to provide such a device in which the leg members are punched in the mounting plate and then bent substantially perpendicular to the plate; and, to provide such a device in which the leg members are positioned along the nodal circle of the transducer such that vibration of the transducer is not substantially impaired by the mounting arrangement.

Other objects and advantages of the present invention will be apparent from the following description, the accompanying drawings, and the appended claims.

DETAILED DESCRIPTION OF THE INVENTION

Figure 1:
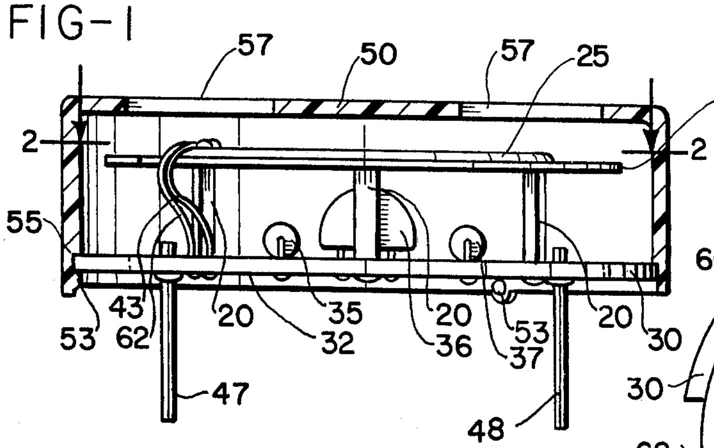
FIG. 1 is a sectional view taken radially through a buzzer of the present invention.

Referring now to FIG. 1, there is shown a radial sectional view of one embodiment of the present invention. A metallic disc element 15 includes a plurality of supporting struts 20. The metallic disc element 15 acts as a mounting plate means for a piezoelectric disc element 25 which is of circular shape and is formed from an appropriate crystal material such as lead zirconate. Supporting struts or leg means 20 are integrally formed from circular mounting plate means 15 and are connected to a printed circuit board means 30. The circuit board 30 has a printed connective pattern on its lower side 32. Struts 20 extend through circuit board 30 and are soldered into place on side 32 by a wave soldering technique. An oscillator circuit means, including components 35, 36, and 37, is mounted on circuit board 30.

Figure 2:
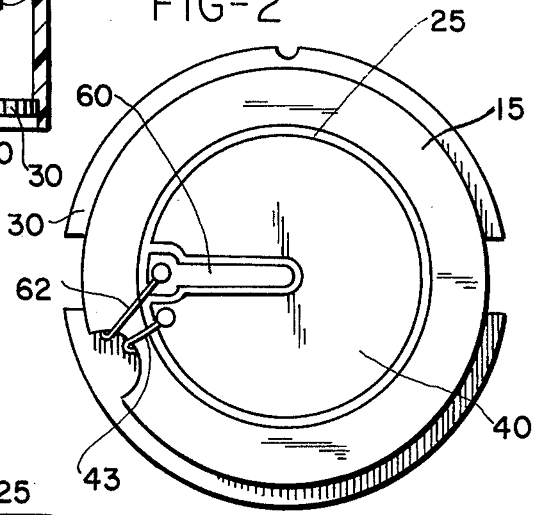
FIG. 2 is an elevational view of the crystal and associated mounting structure taken generally along line 2—2 in FIG. 1.

As shown in FIG. 2, an elevational plan view taken generally along line 2—2 in FIG. 1, the circular piezoelectric crystal 25 includes a first electrode means 40 positioned on the side of crystal 25 opposite mounting plate means 15. Electrode means 40 may typically comprise a silvered electrode which is plated to the surface of the crystal. Connector lead 43 is soldered to electrode 40 and is also soldered to circuit board 30. The portion of crystal 25 adjacent mounting plate 15 also has deposited upon it a silvered electrode (not shown). This electrode is connected to the oscillator circuit via plate 15 and one or more of struts 20. When a voltage potential is applied across piezoelectric disc 25 by the oscillator circuit, the disc is caused to flex. When this potential is removed, the disc returns to its original position. Therefore, by applying an alternating potential to one of struts 20 and to lead 43, the oscillator circuit causes the piezoelectric crystal means 25 and plate 15 to vibrate. A buzzing noise is thus generated.

The piezoelectric disc element 25 has a diameter which is less than that of the metallic disc element 15. The struts 20 are positioned equidistantly around the metallic disc 15 along a nodal circle. As the disc and mounting plate vibrate the center portion will move either up or down and the periphery will move in the opposite direction. Along the nodal circle, however, this movement will be negligible. The stresses applied to the struts 20 by the vibration of the disc and plate will therefore be minimized and the vibration of the transducer will be substantially unimpaired by the mounting arrangement. The power input terminals 47 and 48, generally cylindrical in shape are mounted on circuit board means 30 and are electrically connected to the oscillator circuit. The oscillator circuit is actuated when a sufficient d.c. potential is applied across the power input terminals.

As shown in FIG. 1, cover means 50 encloses the circuit board 30, crystal means 25, mounting plate means 15 and the oscillator circuit means. The cover 50 snaps onto circuit board means 30 and is held in place around the periphery of the circuit board by nubs 53 and shoulder 55 around the interior of cover 50. A number of openings 57 in cover 50 allow the generated sound to pass through the cover.

A second electrode means 60 also plated on the upper surface of the piezoelectric disc 25 is electrically isolated from the first electrode means 40. Electrode means 60 senses the flexure of piezoelectric disc element 25 and supplies a flexure indicating feedback signal via lead 62 to the oscillator circuit. Leads 43 and 62 may advantageously be soldered to electrodes 40 and 60, respectively, at points along the nodal circuit of piezoelectric crystal means 25. Soldering along the nodal circle results in minimization of the vibration of the solder points of the leads, and thus reducing the likelihood that these leads will become disconnected.

In the embodiment of FIG. 1, all of the conductors are terminated along the lower surface 32 of circuit board 30. Struts 20 have tips of reduced size which extend through circuit board 30. As a result a wave soldering technique may be used to connect all of the parts in one step electrically and mechanically, with the exception of cover 50.

Figure 3:
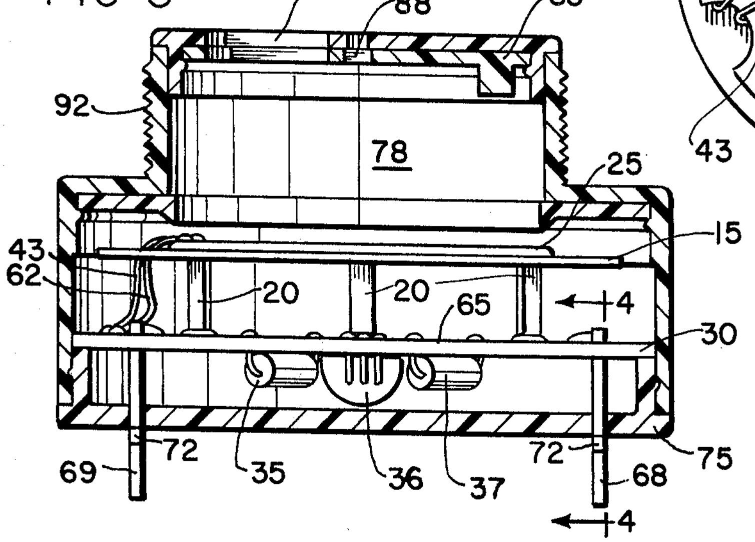
FIG. 3 is a sectional view taken radially through an alternative embodiment of the present invention.
Figure 4:
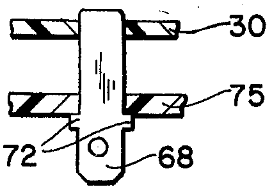
FIG. 4 is an enlarge partial sectional view taken generally along line 4—4 in FIG. 3.
Figure 5:
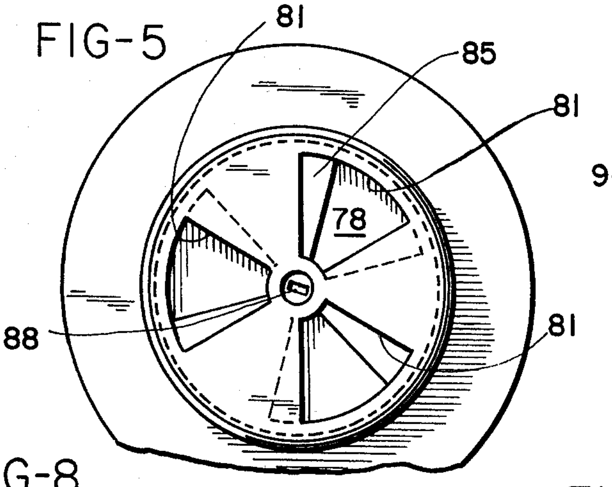
FIG. 5 is a partial plan elevational view of the embodiment of FIG. 3.

FIGS. 3, 4, and 5 show an alternative embodiment of the invention. As is seen in FIG. 3, the circular mounting plate means 15 and the circular piezoelectric crystal means 25 are identical in design to that shown in FIGS. 1 and 2, and are therefore similarly numbered. In this embodiment, however, oscillator circuit components 35, 36, and 37 are positioned on the lower surface of printed circuit board means 30. The electrical leads for these components extend through the circuit board 30 and are soldered to the printed conductive pattern on the upper surface 65 of the circuit board. Similarly, struts 20 extend through circuit board 30 but are soldered to the board on its upper surface.

Power input terminals 68 and 69 are also soldered to circuit board means 30 at surface 65. As shown in FIG. 4, the power input terminals have tabs 72 which prevent them from sliding through case 75. Thus these terminals act to hold circuit board 30 in place. The assembly of the circuit board and oscillator circuit is accomplished in a single wave soldering step in which all of the necessary soldering connections are made along surface 65 of circuit board 30. Additionally, if desired, the solder connections of input terminal 68 and 69 may be accomplished at this time. Because of the interlocking function of terminals 68 and 69, as shown in FIG. 4, case 75 is necessarily in place at the time of this operation. The assembly of the piezoelectric transducer to the circuit board of the embodiment shown in FIG. 3 is accomplished in a separate operation since, otherwise, the transducer would be submerged in solder during the wave soldering process.

As seen in FIGS. 3 and 5, the upper interior portion of cover means 75 defines a chamber 78 which directs the sound waves outwardly through openings 81. A rotating member 85 defines a set of openings identical in shape and position to openings 81 in cover 75. Member 85 may be rotated, as seen in FIG. 5, to partially or completely obstruct openings 81 and thus vary the amplitude level of sound emanating from the transducer. Adjustment of members 85 may be made by inserting a small screwdriver in slot 88.

The chamber 78 is defined by a cylindrical, circumferentially threaded portion 92. This portion may for instance be threaded into an appropriate opening to mount the buzzer device.

Figure 6:
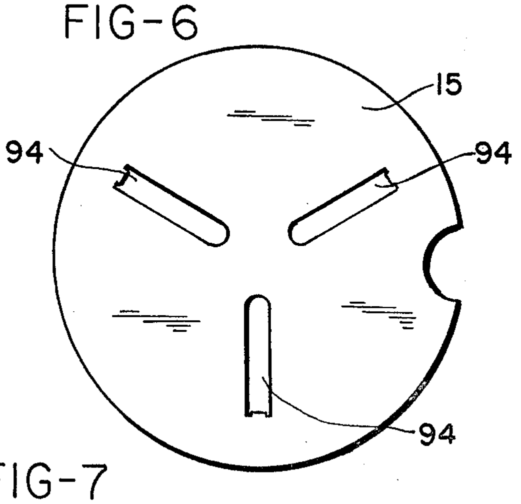
FIG. 6 is a plan elevational view of the mounting plate used in the invention.
Figure 7:
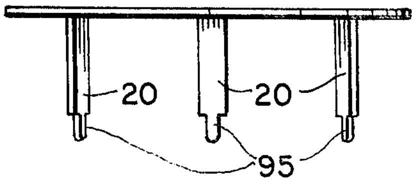
FIG. 7 is a front elevational view of the mounting of FIG. 6.

Referring now to FIGS. 6 and 7, the metallic disc element 15 with its associated integrally formed struts 20 is shown in detail. Each of the struts is formed by punching a strut shaped portion in the metallic disc element and bending the portion so that it is perpendicular to the plane of the disc element. It should be noted that the struts 20 are sufficiently short to allow this construction. The openings 94 are positioned such that the crystal 25 completely covers them. Openings 94 are sufficiently small that crystal 25 is more than adequately supported by the remaining portion of plate 15. The struts terminate in narrowed portions 95 which are fashioned to extend through the circuit board means 30 on which the mounting plate 15 is mounted. This design for plate 15 and associated struts 20 provides for maximum transducer support and permits simple, economical assembly.

Figure 8:
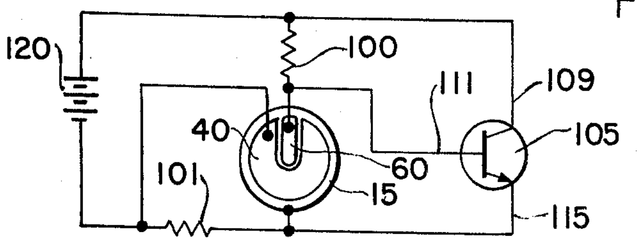
FIG. 8 is a schematic representation of an oscillator circuit useful in implementing the present invention.

In FIG. 8, there is shown a diagrammatic, schematic representation of the transducer and the oscillator circuit. The oscillator circuit includes resistors 100 and 101 and transistor 105. Resistor 100 is connected between the collector terminal 109 and the base terminal 111 of transistor 105. Mounting plate 15, acting as one electrode for the piezoelectric crystal is connected via one of struts 20 (not shown in FIG. 8) to emitter terminal 115 of transistor 105. Resistor 101 is connected between the base terminal 115 of transistor 105 and the first electrode 40 of the tranducer.

With the initial application of a source of potential 120 to the power input terminals, the base terminal 111 of transistor 105 will go positive and transistor 105 will turn ON. Current will flow through the transistor 105 and resistor 101 which may typically be a 1000 ohm, ¼ watt resistor. The potential difference across resistor 101 will thus be applied between metallic disc 15 and first electrode means 40, causing the piezoelectric crystal means to flex. When the piezoelectric crystal flexes, a negative potential will be applied to the second electrode means 60. This negative potential will be fed back to base terminal 111, causing transistor 105 to be switched OFF. When this occurs the current flow through resistor 101 will be terminated and no potential will be applied between plate 15 and electrode 40. The piezoelectric crystal means will then return to its original shape and the cycle will begin again. Thus, the second electrode means 60 acts as a feedback to transistor 105.

While the forms of apparatus herein described constitute preferred embodiments of the invention, it is to be understood that the invention is not limited to these precise forms of apparatus, and that changes may be made therein without departing from the scope of the invention.

What is claimed is:

1. A piezoelectric sonic transducer device comprising a metallic disc element, supporting struts having a thickness substantially the same as that of the metallic disc element and integrally connected to said metallic disc element on the nodal circle of the transducer device, said disc element defining radially extending openings therein from which said struts have been punched but which do not substantially affect vibration of said disc element, a piezoelectric disc element, having a diameter less than that of said metallic disc element but greater than that of said nodal circle of the transducer device mounted on said metallic disc element such that said radially extending openings defined therein are covered, circuit board means providing a base to which said struts are attached, first electrode means positioned on the surface of said piezoelectric disc element opposite said metallic disc element, and oscillator circuit means, electrically connected to said first electrode and to one of said struts, for impressing an alternating potential across said piezoelectric disc element to cause said piezoelectric disc element and said metallic disc element to vibrate.

2. The device of claim 1 further comprising second electrode means, positioned on the side of said piezoelectric disc element opposite said metallic disc element and electrically isolated from said first electrode means, for sensing the flexure of said piezoelectric element and supplying a flexure indicating feedback signal to said oscillator circuit.

* * * * *